US010170660B2

(12) United States Patent
Balakrishnan et al.

(10) Patent No.: US 10,170,660 B2
(45) Date of Patent: Jan. 1, 2019

(54) DIGITAL ALLOY GERMANIUM HETEROJUNCTION SOLAR CELL

(71) Applicant: INTERNATIONAL BUSINESS MACHINES CORPORATION, Armonk, NY (US)

(72) Inventors: Karthik Balakrishnan, White Plains, NY (US); Stephen W. Bedell, Wappingers Falls, NY (US); Pouya Hashemi, White Plains, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/978,469

(22) Filed: Dec. 22, 2015

(65) Prior Publication Data

US 2017/0179316 A1   Jun. 22, 2017

(51) Int. Cl.
| | |
|---|---|
| *H01L 31/028* | (2006.01) |
| *H01L 31/18* | (2006.01) |
| *H01L 31/0747* | (2012.01) |
| *H01L 31/0352* | (2006.01) |
| *H01L 31/036* | (2006.01) |
| *H01L 31/0745* | (2012.01) |

(52) U.S. Cl.
CPC ........ *H01L 31/1804* (2013.01); *H01L 31/028* (2013.01); *H01L 31/036* (2013.01); *H01L 31/035254* (2013.01); *H01L 31/0745* (2013.01); *H01L 31/0747* (2013.01); *Y02E 10/547* (2013.01)

(58) Field of Classification Search
CPC ............................... H01L 35/26; H01L 35/22
USPC .......................................................... 136/205
See application file for complete search history.

(56) References Cited

U.S. PATENT DOCUMENTS

| | | | | |
|---|---|---|---|---|
| 4,711,857 | A | * | 12/1987 | Cheng .................. B82Y 20/00 257/21 |
| 5,880,482 | A | * | 3/1999 | Adesida .............. H01L 31/1085 257/189 |
| 9,935,185 | B2 | | 4/2018 | Balakrishnan et al. |
| 2002/0017642 | A1 | * | 2/2002 | Mizushima ....... H01L 21/02381 257/19 |
| 2010/0065111 | A1 | * | 3/2010 | Fu ........................ H01L 31/068 136/255 |

(Continued)

FOREIGN PATENT DOCUMENTS

CN         104681651 A   *   6/2015

OTHER PUBLICATIONS

Song et al., CN 104681651 A, English Machine Translation, China Patent, pp. 1-5.*

(Continued)

*Primary Examiner* — Tae-Sik Kang
(74) *Attorney, Agent, or Firm* — Tutunjian & Bitetto, P.C.; L. Jeffrey Kelly

(57) ABSTRACT

A photovoltaic device includes a digital alloy buffer layer including a plurality of alternating layers of semiconductor material. An absorption layer epitaxially is grown on the digital alloy buffer layer, an intrinsic layer is formed on the absorption layer and a doped layer is formed on the intrinsic layer. A conductive contact is formed on the doped layer.

18 Claims, 2 Drawing Sheets

(56) References Cited

U.S. PATENT DOCUMENTS

| | | | |
|---|---|---|---|
| 2010/0229926 A1* | 9/2010 | Newman | H01L 31/06875 136/255 |
| 2014/0196773 A1* | 7/2014 | Bedell | H01L 31/0735 136/255 |
| 2015/0028286 A1* | 1/2015 | Vu | H01L 27/1446 257/21 |
| 2015/0263095 A1 | 9/2015 | Chan et al. | |

OTHER PUBLICATIONS

Lee, B.H. et al., "Performance enhancement on sub-70nm strained silicon SOI MOSFETs on Ultra-thin Thermally Mixed Strained silicon/SiGe on Insulator(TM-SGOI) substrate with Raised S/D" IEDM (2002) pp. 946-948.

Asen-Palmer, M. et al., "Thermal conductivity of germanium crystals with different isotopic compositions" Physical Review B (Oct. 15, 1997) pp. 9431-9447, vol. 56, No. 15.

List of IBM Patents or Patent Applications Treated as Related dated Dec. 22, 2015, 2 pages.

List of IBM Patents or Patent Applications Treated as Related dated Jun. 5, 2017, 2 pages.

Office Action Issued in U.S. Appl. No. 15/847,250 dated Jul. 25, 2018, 7 pages.

\* cited by examiner

DIGITAL ALLOY GERMANIUM
HETEROJUNCTION SOLAR CELL

BACKGROUND

Technical Field

The present invention relates to photovoltaic devices, and more particularly to devices and methods for formation for a photovoltaic device that includes a digital alloy.

Description of the Related Art

In Si heterojunction solar cells (also known as heterojunction with intrinsic thin-layer (HIT) cells), diffused junctions, which are employed in conventional Si solar cells, are replaced by amorphous Si (a-Si:H)/crystalline Si (c-Si) heterojunctions. This offers an advantage of low-temperature, low-cost processing (due the low-cost and low-temperature deposition of a-Si:H at ~200 degrees C. compared to that of >600 degrees C. for diffusion). In addition, high open circuit voltages due to the excellent surface passivation properties of a-Si:H are also obtained. This concept may also be applied to Ge substrates to obtain higher short circuit currents due to a stronger absorption of sunlight in Ge. However, the high cost of Ge substrates counters such advantages.

To address this issue, rapid and low-cost epitaxial growth of Ge on Si substrates has been employed to fabricate Ge heterojunction solar cells. This employs growth of a graded buffer layer comprised of SiGe on the Si substrate in which the concentration of Ge is gradually increased to avoid excessive accumulated strain due to lattice mismatch between Si and Ge. This prevents high dislocation density or the disruption of the epitaxy; however, thermal generation and recombination of minority carriers occurs in such a buffer layer. This is to the first order proportional to the thickness of the buffer layer, and contributes to the efficiency loss of the solar cell accordingly.

SUMMARY

A photovoltaic device includes a digital alloy buffer layer including a plurality of alternating layers of semiconductor material. An absorption layer is epitaxially grown on the digital alloy buffer layer, an intrinsic layer is formed on the absorption layer and a doped layer is formed on the intrinsic layer. A conductive contact is formed on the doped layer.

A photovoltaic device includes a monocrystalline Si substrate and a digital alloy buffer layer epitaxially grown on the substrate. The digital alloy buffer layer includes a plurality of alternating layers of SiGe material. An absorption layer is epitaxially grown on the digital alloy buffer layer and an amorphous Si intrinsic layer is formed on the absorption layer. An amorphous Si doped layer is formed on the intrinsic layer, and a conductive contact is formed on the doped layer.

A method for forming a photovoltaic device includes forming a digital alloy buffer layer including a plurality of alternating layers of semiconductor material on a substrate; epitaxially growing an absorption layer on the digital alloy buffer layer; forming an intrinsic layer on the absorption layer; forming a doped layer on the intrinsic layer; and forming a conductive contact on the doped layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
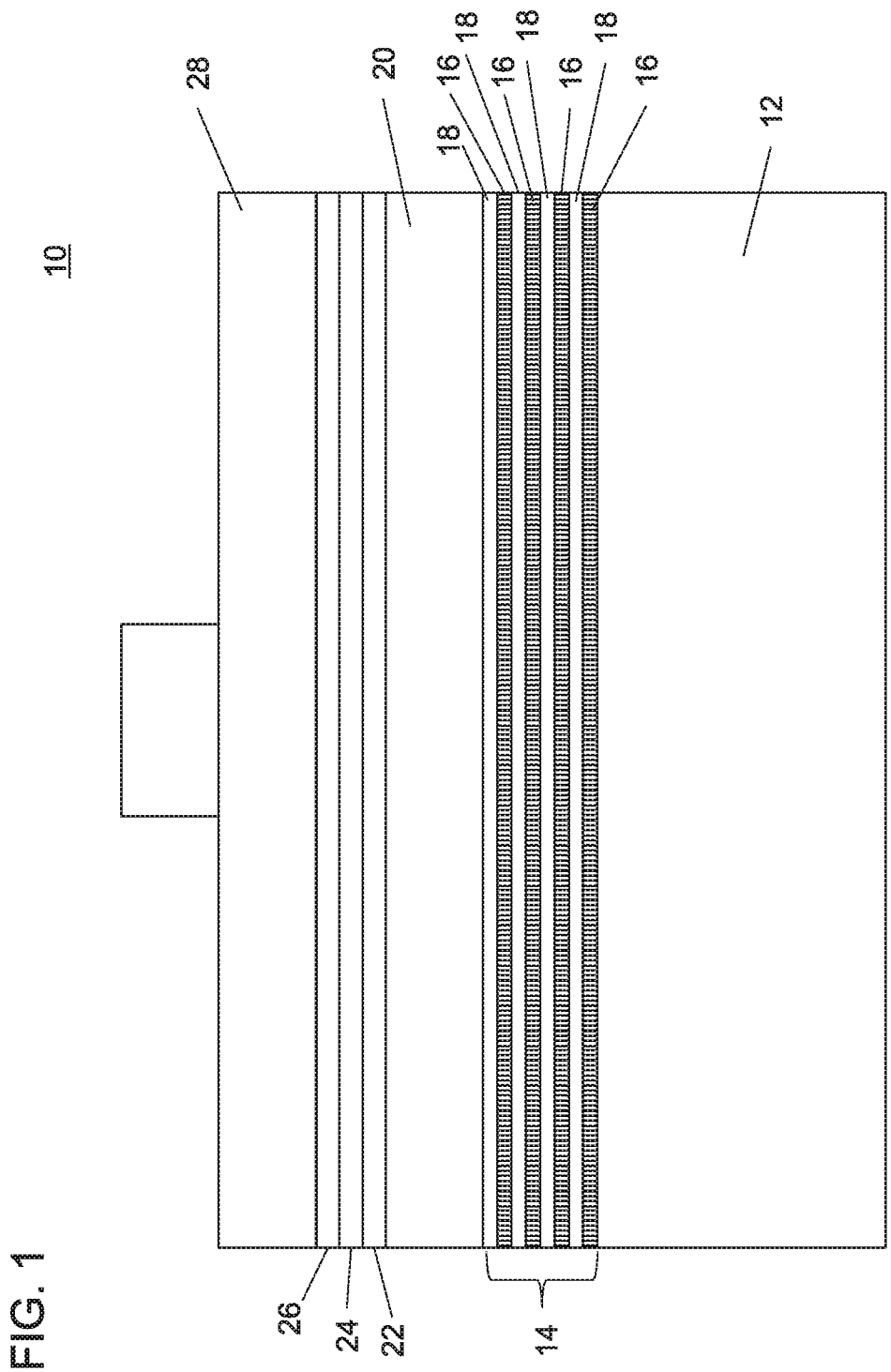
FIG. 1 is a cross-sectional view of a photovoltaic device having a digital alloy buffer layer in accordance with the present principles.

In accordance with the present principles, heterojunction photovoltaic devices (e.g., solar cells) are provided that include a digital alloy buffer layer. A digital alloy buffer layer includes alternating layers of different materials or different dopant concentrations. If a digital alloy is comprised of epitaxially grown semiconductors which are not lattice-matched to each other, the thickness of each of the alternating layers can be kept below the critical thickness that would otherwise result in an (excessively) high dislocation density due to the accumulation of mismatch strain. Therefore, the overall thickness of a digital alloy can be reduced compared to that of a conventional graded buffer.

In useful embodiments, the digital alloy is disposed between a substrate, e.g., Si, and an absorption layer (e.g., Ge (or SiGe)) of the heterojunction solar cell. A thickness of the digital alloy buffer layer (and therefore the associated recombination loss) is therefore considerably decreased compared to that of a conventional buffer layer.

Other advantages of the structures in accordance with the present principles include improved thermal conductivity across the buffer layer due to lower mass variance effects as well as a thinner buffer, hence smaller open circuit voltage drop due to heat accumulation. In addition, a possibility of employing isotopically enhanced SiGe is provided for better heat conduction in some embodiments. Reduced materials and process costs and increased throughput due to thinner buffer layer are also achieved.

Digital alloys, or short-period superlattices (SPSs) may include binary or ternary layers with periods of a few monolayers (MLs). The layers may be formed using molecular beam epitaxy (MBE) growth of binary, ternary or quaternary materials of various compositions with enhanced band offset, and without additional source cells and laborious change of cell temperature during growth interruption in a digital-alloy MBE growth technique.

In one embodiment, the digital alloy buffer layer may include a digital SiGe alloy having a plurality of layers. In one embodiment, each layer may include a different concentration of Ge. In another embodiment, layers are stacked with alternating concentrations of Ge. In a particularly useful embodiment, layers are stacked with alternating layers of Si and Ge.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may form a tandem (multi-junction) structure with multiple stacked cells; however, other architectures, structures, substrate materials and process features and steps may be varied within the scope of the present invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic device 10 is shown in accordance with an illustrative embodiment. The photovoltaic device 10 may include a p-type substrate 102. The substrate 12 preferably includes silicon and may be single-crystalline (c-Si). The substrate 102 may include a thickness of about 100 to 300 microns, although other thicknesses may be employed.

The substrate 102 includes a superlattice stack or a digital alloy buffer layer 14 formed thereon. The digital alloy buffer layer 14 may include alternating layers or different elements, e.g., Si and Ge layers or may include alternating layers of different compositions of the same elements, e.g., different Ge concentration in SiGe layers. While the digital alloy 14 is described in terms of Si and Ge, other materials and material combinations may be employed, such as, e.g., Si and C, etc. The number of layers (16, 18) n is greater than 2 (e.g., at least one layer 16 and one layer 18). A greater number of layers (more than 8) is preferred. The digital alloy layer 14 includes semiconducting materials having a thickness of a few monolayers to a few nanometers for each layer 16, 18.

In one embodiment, the layers 16, 18 are epitaxially grown and include a monocrystalline structure. The epitaxial growth may be performed by, e.g., molecular beam epitaxy or other epitaxial growth processes. The digital alloy buffer layer 14 may include an overall thickness of between about 20 nm to about 200 nm. An absorption layer 20 is formed on the digital alloy layer 14. The absorption layer 20 may include epitaxially grown SiGe or Ge. The absorption layer 20 may be doped (e.g., p-doped). The absorption layer 20 may include a thickness of between about 2-4 microns although other thickness may be employed.

An optional strained cap layer 22 may be formed on the absorption layer 20. The strained cap layer 22 may include Si, and may have a thickness of, e.g., 1-5 nm. An intrinsic layer 24 may be formed on the absorption layer 20 or on the cap layer 22, if present. The intrinsic layer 24 may include semiconducting material(s) forming passivation intrinsic layers or i-layer(s) that may include a-Si:H, a-Ge:H, a-Si-Ge$_x$:H, a-SiC$_x$:H, or combinations of these materials. The semiconducting material(s) forming intrinsic layer 24 may include amorphous, nanocrystalline, microcrystalline or polycrystalline films(s) and may or may not contain hydrogen.

A doped layer 26 is formed on the intrinsic layer 24. The doped layer 26 may include appropriate n-type or p-type materials. The doped layer 26 has a conductivity type opposite to that of the absorption layer 20. For example, when the absorption layer 20 is comprised of a p-type semiconductor, the doped layer 26 is comprised of an n-type semiconductor, and when the absorption layer 20 is comprised of an n-type semiconductor, the doped layer 26 is comprised of a p-type semiconductor. In one embodiment, the doped layer 26 includes n+ doped a-Si:H. The thickness of the layer 24 is preferably less than about 20 nm, e.g., 4-5 nm. The thickness of the layer 26 is preferably less than about 20 nm, e.g., 10-12 nm.

A transparent conductive material 28 is formed on the doped layer 26 to permit light to enter the absorption layer 20. The transparent conductive material 28 may include a transparent conductive oxide (TCO), such as indium tin oxide (ITO), zinc oxide, indium zinc oxide (IZO), etc. The transparent conductive material 28 may also have anti-reflective properties. If layer 28 is composed of a transparent conductive material, metal fingers 30 or a metal grid is needed to permit for low electrical contact resistance. The metal 30 may include, e.g., gold, aluminum, silver, tungsten, etc. Other structures may also be included such as, anti-reflection coatings, buffers, protective coatings, etc. The layer 28 and metal 30 form a conductive or ohmic contact.

Conventional commercial HIT cells provide lower cost, higher open circuit voltage, $V_{oc}$ (and efficiency) than diffused cells due to a-Si:H contacts. Graded Ge cells provide a higher short circuit current, $J_{sc}$, due to better absorption in Ge. This enables rapid low-cost growth of Ge on Si instead of using prohibitively expensive Ge wafers. The devices in accordance with the present principles provide all the benefits of SiGe HIT cells, and in addition, a thinner SiGe buffer layer is provided using the digital alloy buffer layer 14. Thus, lower recombination loss is achieved in the buffer layer 12 with a higher $V_{oc}$. In addition, better heat conduction is provided through the SiGe buffer layer 14; thus reduced $V_{oc}$ degradation due to heating is also achieved.

In useful embodiments, the Ge fraction in the digital alloy buffer layer 14 may include 0.4 as an average. This means that layers 16 may include a Ge fraction of 0.3 and layer 18 may include a Ge fraction of 0.5 to average 0.4. Other Ge fractions may be employed and are complemented, e.g., averages may range in some embodiments between about 0.2 to about 0.6.

In epitaxially grown SiGe, the effective lifetime of minority carriers, for example, that of electrons in p-type material ($\tau_n$) decreases as Ge fraction increases. As an example, with Ge fraction (x) 0.4, i.e., x=0.4, $\tau_n$=5×10$^{-7}$ sec, $n_i$=2×10$^{11}$ cm$^{-3}$, $N_A$=10$^{18}$ cm$^{-3}$, $t_{SiGe}$=5 μm, where $n_i$ is intrinsic carrier density, $N_A$ is density of p-type dopants (acceptors) and $t_{SiGe}$ is a thickness of the crystalline SiGe layer, the dark current density ($J_{dark}$) can be computed as: $J_{dark}$=qt$_{SiGe}$(n$_i^2$/NA)/$\tau_n$=6.4 pA/cm$^2$, where q is the electron charge (coulombs). If the light current density $J_{light}$=20 mA/cm$^2$, then $V_{oc}$<(kT/q) ln($J_{light}/J_{dark}$)=568 mV, where T is absolute temperature and k is Boltzmann's constant.

In accordance with the present principles, if a digital alloy buffer layer 14 is employed, and the thickness $t_{SiGe}$ may be reduced is reduced to 50 nm. This results, e.g., in $J_{dark}$k=64 fA/cm$^2$ setting an upper limit of about 688 mV (assuming a same minority carrier lifetime). This is a significant boost to the upper limit for $V_{oc}$ (compared to 568 mV for a conventional graded buffer).

In one embodiment, isotopically enriched SiGe is employed for the digital alloy buffer layer 14. The introduction of isotopes of Ge and/or Si maybe employed to further improve heat transfer across the buffer layer 14.

SiGe alloy layers have reduced thermal conductivity (compared to either Si or Ge) which can affect the characteristics of semiconductor devices. An increase in the thermal conductivity can be achieved by reducing mass variance, g, of the SiGe alloy layer 14 and/or strained Si layer 22, if present. Reduction of mass variation increases phonon lifetime, thus increasing the thermal conductivity.

Phonon mean free path, $L_f$~gT$^{-4}$, with T as the absolute temperature and g as the mass variance. The mass variance, g, may be computed as follows.

$$g = \frac{\sum c_i M_i^2 - \left(\sum c_i M_i\right)^2}{\left(\sum c_i M_i\right)^2},$$

where $c_i$ and $M_i$ are the concentration and the mass of isotope i. Therefore, the phonon mean path is increased with a larger difference between isotope mass and concentration. The digital alloy buffer layer 14 may include adjustments to the mass variance, g, e.g., higher concentrations of heavier isotopes to improve thermal conductivity of the digital alloy 14.

The principle manner in which mass variance, g, is reduced is to grow the digital alloy buffer 14 using single isotopes of Ge and/or Si (e.g., minimize i in the above expression). Layers formed using atomic isotope compositions that differ from their natural abundance are said to be isotopically enriched. For example, isotopically enriched layers containing Ge isotopes: $^{70}$Ge, $^{72}$Ge, $^{73}$Ge, $^{74}$Ge and $^{76}$Ge may be employed in the Ge or SiGe of the digital alloy 14 to improve phonon mean free path and thermal conductivity with the more abundant species $^{70}$Ge, $^{72}$Ge, and $^{76}$Ge being preferred. In addition or instead, the strained layer 22 (if present) may have mass variance changed to improve phonon length and thermal conductivity. For example, Si isotopes: $^{28}$Si, $^{29}$Si, $^{30}$Si may be employed with $^{28}$Si being preferred.

The isotope mass and concentration may be altered using source materials (in a vacuum chamber) including these isotopes in a particular concentration to be deposited during epitaxial growth. The layers 16, 18 may include different isotopes or the same isotopes and include different proportions of Ge. It should also be understood that the photovoltaic device 10 may include regions and materials that include opposite doping types from those described.

Figure 2:
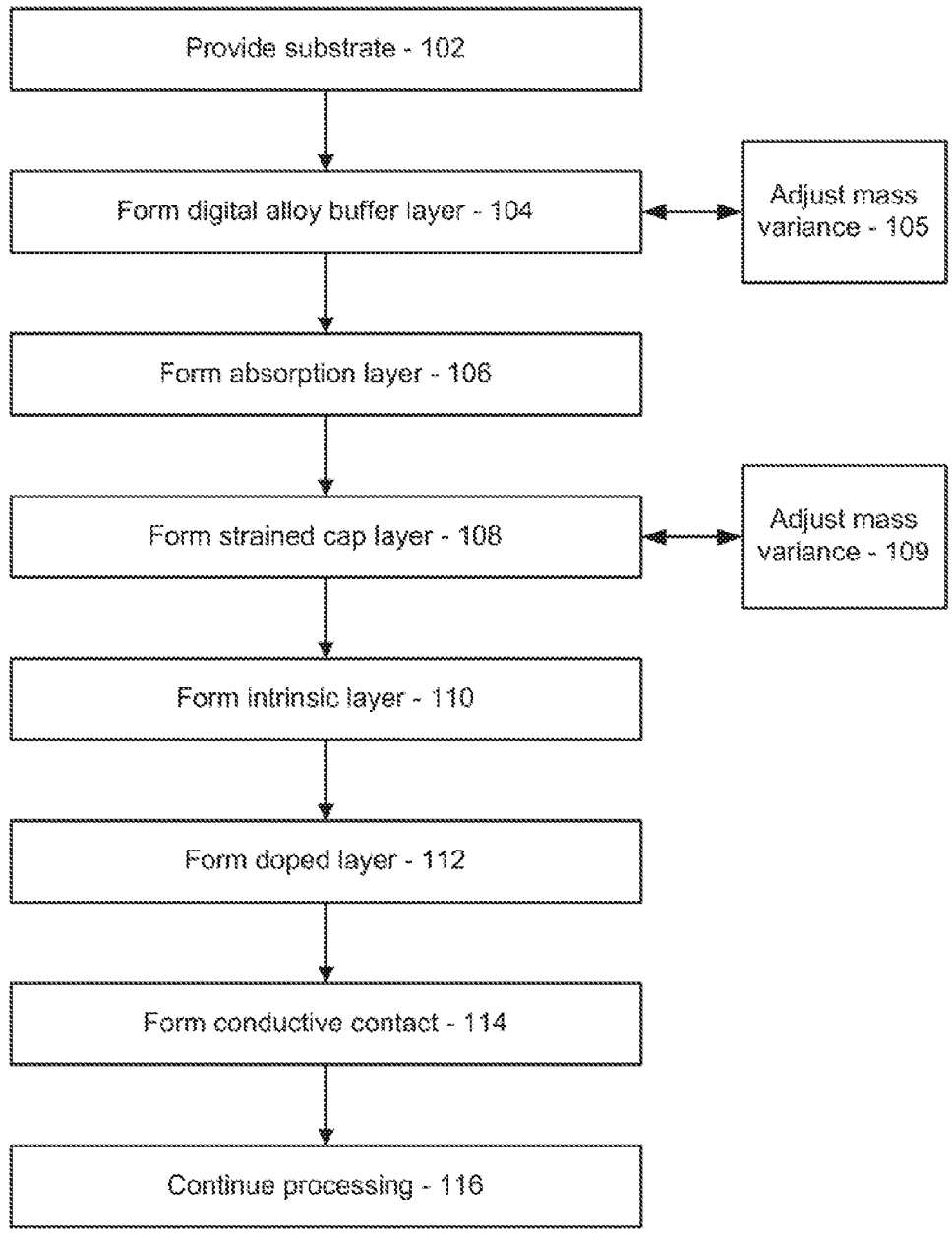
FIG. 2 is a block/flow diagram showing a method for fabricating a photovoltaic device having a digital alloy buffer layer in accordance with illustrative embodiments.

Referring to FIG. 2, methods for forming a photovoltaic device are illustratively depicted in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a substrate is provided. The substrate may be a p-type substrate and may include Si. The substrate may be removed later in some embodiments. In block 104, a digital alloy buffer layer is formed on the substrate. The digital alloy buffer layer includes a plurality of alternating layers of semiconductor material. The alternating layers may include alternating materials (e.g., Si and Ge) in the alternating layers or may include alternating material compositions of a same compound (e.g., SiGe) in the alternating layers. For example, the digital alloy buffer layer may include SiGe with a Ge fraction between about 0.2 and 0.6. The alternating layers may be formed using molecular beam epitaxy. The alternating layers are preferably monocrystalline.

In block 105, a mass variance may be adjusted to increase thermal conductivity of the digital alloy buffer by isotope enrichment. The adjustment may be made by controlling the concentration (and/or mass) of different isotopes in the layer.

In block 106, an absorption layer is epitaxially grown on the digital alloy buffer layer. The absorption layer may include SiGe or Ge. The absorption layer may be p-doped. In block 108, a strained cap layer may be formed between on the absorption layer.

In block 109, a mass variance may be adjusted to increase thermal conductivity of the cap layer by isotope enrichment in the digital alloy buffer layer. The adjustment may be made by controlling the concentration (and/or mass) of different isotopes in the layer.

In block 110, the intrinsic layer may be formed on the absorption layer. The intrinsic layer may include an amorphous Si material. In block 112, a doped layer may be formed on the intrinsic layer. The doped layer may include n+ doping of an amorphous Si material. In block 114, a conductive contact is formed on the doped layer. The contact may include TCO material(s) and/or a patterned metal grid. In block 116, processing continues as needed to complete the device.

Having described preferred embodiments digital alloy germanium heterojunction solar cell (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A photovoltaic device, comprising:
a digital alloy buffer layer including a plurality of alternating layers of semiconductor material, wherein the digital alloy buffer layer includes a mass variance adjusted by isotropic enrichment in the digital alloy buffer layer to increase thermal conductivity of the digital alloy buffer layer;
an absorption layer epitaxially grown directly on the digital alloy buffer layer;
an intrinsic layer formed on the absorption layer;
a doped layer formed on the intrinsic layer; and
a metal contact formed on the doped layer.

2. The device as recited in claim 1, wherein the digital alloy buffer layer includes alternating materials in the alternating layers.

3. The device as recited in claim 1, wherein the alternating layers include Si and Ge.

4. The device as recited in claim 1, wherein the digital alloy buffer layer includes alternating material compositions of a compound in the alternating layers.

5. The device as recited in claim 4, wherein the compound includes SiGe.

6. The device as recited in claim 5, wherein a Ge fraction for the alternating layers is between about 0.2 and 0.6.

7. The device as recited in claim 1, further comprising a strained cap layer disposed between the absorption layer and the intrinsic layer.

8. The device as recited in claim 7, wherein the strained cap layer includes a mass variance configured to increase thermal conductivity of the strained cap layer by isotopic enrichment of the strained cap layer.

9. A photovoltaic device, comprising:
a monocrystalline Si substrate;
a digital alloy buffer layer epitaxially grown on the substrate, the digital alloy buffer layer including a plurality of alternating layers of SiGe material, wherein the digital alloy buffer layer includes a mass variance adjusted by isotropic enrichment in the digital alloy buffer layer to increase thermal conductivity of the digital alloy buffer layer;
an absorption layer epitaxially grown directly on the digital alloy buffer layer;
an amorphous Si intrinsic layer formed on the absorption layer;
an amorphous Si doped layer formed on the intrinsic layer; and
a metal contact formed on the doped layer.

10. The device as recited in claim 9, wherein the digital alloy buffer layer includes alternating material compositions of SiGe in the alternating layers.

11. The device as recited in claim 10, wherein the alternating material compositions of SiGe include a Ge fraction between about 0.2 and 0.6.

12. The device as recited in claim 9, further comprising a strained cap layer disposed between the absorption layer and the intrinsic layer.

13. The device as recited in claim 12, wherein the strained cap layer includes a mass variance configured to increase thermal conductivity of the strained cap layer by isotopic enrichment of the strained cap layer.

14. A photovoltaic device, comprising:
a digital alloy buffer layer including a plurality of alternating layers of semiconductor material;
an absorption layer epitaxially grown on the digital alloy buffer layer;
a strained cap layer formed on the absorption layer, wherein the strained cap layer includes a mass variance adjusted by isotopic enrichment in the strained cap layer to increase thermal conductivity of the strained cap layer;
an intrinsic layer formed on the strained cap layer;
a doped layer formed on the intrinsic layer; and
a conductive contact formed on the doped layer.

15. The device as recited in claim 14, wherein the digital alloy buffer layer includes alternating materials in the alternating layers.

16. The device as recited in claim 14, wherein the alternating layers include Si and Ge.

17. The device as recited in claim 14, wherein the digital alloy buffer layer includes alternating material compositions of a compound in the alternating layers.

18. The device as recited in claim 17, wherein the compound includes SiGe.

\* \* \* \* \*